US 6,465,887 B1

(12) United States Patent
Chu et al.

(10) Patent No.: US 6,465,887 B1
(45) Date of Patent: Oct. 15, 2002

(54) ELECTRONIC DEVICES WITH DIFFUSION BARRIER AND PROCESS FOR MAKING SAME

(75) Inventors: Tak Kin Chu, Bethesda, MD (US); Francisco Santiago, Fredrickburg, VA (US); Kevin A. Boulais, Waldorf, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/563,740

(22) Filed: May 3, 2000

(51) Int. Cl.[7] .......................... H01L 23/48; H01L 29/43
(52) U.S. Cl. ...................... 257/751; 257/762; 257/767; 438/584
(58) Field of Search ................................. 257/751, 762, 257/767

(56) References Cited

U.S. PATENT DOCUMENTS

| 4,291,327 A | 9/1981 | Tsang ........................... 357/52 |
| 4,550,331 A | 10/1985 | Milano ......................... 357/24 |
| 4,692,993 A | 9/1987 | Clark et al. .................... 437/53 |
| 4,847,666 A | 7/1989 | Heremans et al. ............. 357/16 |
| 4,915,746 A | 4/1990 | Welsch .......................... 148/4 |

(List continued on next page.)

FOREIGN PATENT DOCUMENTS

| EP | 851483 | 7/1998 | ......... H01L/21/768 |
| EP | 881673 | 12/1998 | ......... H01L/21/768 |
| JP | 2-266569 | 10/1990 | |
| JP | 6-310509 | 11/1994 | |
| WO | WO 00/11731 | 3/2000 | ........... H01L/29/43 |

OTHER PUBLICATIONS

S.M. Sze, "Semiconductor Devices Physics and Technology", 1985, pp. 208–210.

Truscott, et al., "MBE growth of $BaF_2$/(Ga,In)(As,Sb) Structures", Journal of Crystal Growth, vol. 81 (1987), pp. 552–556.

Clemens, et al., "Growth of $BaF_2$ and of $BaF_2/SrF_2$ layers on (001) oriented GaAs", J. Appl. Phys., vol. 66, No. 4, Aug. 15 1989, pp. 1680–1685.

Hung, et al., " Epitaxial growth of alkaline earth fluoride films on HF–treated Si and $(NH_4)_2$ $S_x$–treated GaAs without in situ cleaning", Appl. Phys. Lett., vol. 60, No. 2, Jan. 13, 1992, pp. 201–203.

Chaudhari, et al., "Calcium Fluoride thin films on GaAs (100) for possible metal–insulator–semiconductor applications", Appl. Phys. lett., vol. 62, No. 8, Feb. 22, 1993, pp. 852–854.

(List continued on next page.)

Primary Examiner—Gene M. Munson
(74) Attorney, Agent, or Firm—James B. Bechtel, Esq.; Kevin J. Dunleavy, Esq.

(57) ABSTRACT

An epitaxial barrier material provides not only a unique growth medium for growing single crystal structures of elemental metal thereon, but also provides an effective diffusion barrier at extremely thin thicknesses against migration of atoms from the metallization layer into an adjacent semiconductor substrate or low dielectric insulation layer. This invention is particularly advantageous for forming single crystal, transition metal conductor lines, contacts, filled trenches, and/or via plugs, and especially conductor structures based on transition metals of copper, silver, gold, or platinum. These metals are highly attractive for interconnect strategies on account of there respective low resistivity and high reliability characteristics. Processes for making the barrier film in a semiconductor device are also covered. The capability to use copper interconnect strategies coupled with the proviso of an extremely thin barrier film makes possible a significant increase in the component density and a corresponding reduction in the number of layers in large scale integrated circuits, as well as improved performance.

21 Claims, 9 Drawing Sheets

U.S. PATENT DOCUMENTS

| | | | |
|---|---|---|---|
| 5,124,762 A | 6/1992 | Childs et al. ................. 357/16 |
| 5,151,168 A | 9/1992 | Gilton et al. ................ 205/123 |
| 5,225,031 A | 7/1993 | McKee et al. ............... 156/612 |
| 5,248,633 A | 9/1993 | Morar et al. ................. 437/196 |
| 5,378,905 A | 1/1995 | Nakamura ................... 257/213 |
| 5,391,517 A | 2/1995 | Gelatos et al. .............. 437/190 |
| 5,435,264 A | 7/1995 | Santiago et al. ............... 117/92 |
| 5,690,737 A | 11/1995 | Santiago et al. ............... 117/92 |
| 5,482,003 A | 1/1996 | McKee et al. ............... 117/108 |
| 5,498,909 A * | 3/1996 | Hasunuma et al. ......... 257/762 |
| 5,569,538 A | 10/1996 | Cho ........................... 428/427 |
| 5,593,951 A | 1/1997 | Himpsel ..................... 505/235 |
| 5,637,533 A | 6/1997 | Choi ........................... 438/643 |
| 5,661,345 A * | 8/1997 | Wada et al. ................. 257/767 |
| 5,670,420 A | 9/1997 | Choi ........................... 437/189 |
| 5,677,572 A | 10/1997 | Hung et al. .................. 257/750 |
| 5,695,810 A | 12/1997 | Dubin et al. ................... 427/96 |
| 5,696,018 A | 12/1997 | Summerfelt et al. .......... 437/60 |
| 5,753,040 A | 5/1998 | Cho ........................... 117/106 |
| 5,773,085 A | 6/1998 | Inoue et al. .............. 427/255.2 |
| 5,773,359 A | 6/1998 | Mitchell et al. ............. 438/614 |
| 5,824,590 A | 10/1998 | New ........................... 438/393 |
| 5,824,599 A | 10/1998 | Schacham-Diamand et al. ........... 437/230 |
| 5,932,006 A | 8/1999 | Santiago et al. ............... 117/92 |
| 6,077,775 A | 6/2000 | Stumborg et al. ........... 438/643 |
| 6,083,818 A | 7/2000 | Stumborg et al. ........... 438/603 |
| 6,144,050 A * | 11/2000 | Stumborg et al. ........... 257/213 |
| 6,171,953 B1 * | 1/2001 | Stumborg et al. ........... 257/751 |
| 6,188,134 B1 * | 2/2001 | Stumborg et al. ........... 257/751 |
| 6,238,001 B1 | 3/2001 | Santiago et al. ............. 257/410 |
| 2001/0035581 A1 * | 11/2001 | Stumborg et al. ........... 257/751 |

OTHER PUBLICATIONS

Colbow, et al., "Photoemission study of the formation of $SrF_2$/GaAs(100) and $BaF_2$/GaAs(100) interface", Physical Review B, vol. 49, No. 3, Jan. 15, 1994, pp. 1750–1756.

Chu, et al., "The Role of Barium in the Heteroepitaxial Growth of Insulator and Semiconductors on Silicon", Mat. Res. Symp. Proc., vol. 334, 1994, pp. 501–506.

Stumborg, et al., "Determination of growth mechanisms of MBE grown $BaF_2$ on Si(100) by target angle dependence of RBS yields", Nucl. Instr. and Methods in Physics Res. B, vol. 95, 1995, pp. 319–322.

Stumborg, et al., "Growth and interfacial chemistry of insulating (100) barium fluoride on gallium arsenide", J. Appl. Phys., vol. 77, No. 6, Mar. 15, 1995, pp. 2739–2744.

Stumborg et al., "Surface chemical state populations in the molecular beam epitaxy deposition of $BaF_2$ on GaAs by x-ray photoelectron spectroscopy and heavy-ion backscattering spectroscopy", J. Vac. Sci. Technol., vol. 14, No. 1, Jan./Feb. 1996, pp. 69–79.

Chu, et al., "Heteroepitaxial deposition of Group IIa fluorides on gallium arsenide", Mat. Sci. and Eng. B, vol. B47, 1997, pp. 224–234.

D. Gardner, et al. " Encapsulated Copper Interconnection Devices using Sidewall Barriers", Proc. 8th Int'l IEEE VLSI MVIC, Jun. 1991, pp. 99–108.

T. Wade, "Gas Dome System Provides Unity-k Dielectric", Semiconductor Int'l, Jul. 1999, 6 pages total.

Abe et al., "Metal Base Transistor of In/Bi $(Ba,Rb)O_3$/$SrTiO_3$ (Nb)", IEEE, vol. 14, Mar. 1993 pp. 100–102.

* cited by examiner

Image (A)

Image (B)

ELECTRONIC DEVICES WITH DIFFUSION BARRIER AND PROCESS FOR MAKING SAME

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

This invention relates generally to the fabrication of semiconductor devices, and particularly to an advanced barrier film useful for forming single crystal metal in electronic devices.

Integrated circuits (ICs) are composed of vast number of active components such as transistors, resistors, and capacitors, and other active devices. These individual components are generally laid out in a two dimensional array on a substrate, such as silicon or gallium arsenide. The two dimensional arrays are often stacked on top of one another to form a three dimensional IC. As in any circuit, these components, and the several layers, must be connected to one another electrically. Interconnection on the two dimensional surfaces is accomplished by depositing lines or strips of metal that act as connecting "wires". Likewise, different levels of the metallization are interconnected vertically by metal plugs deposited in via holes made between the separate layers (levels). These steps in the manufacturing process are commonly referred to as "metallization," and are generally done as part of back-end-of-the-line processing.

Generally, silicon is the substrate material of choice, aluminum is the metal of choice for two dimensional IC metallization, and tungsten is the metal of choice for filling via holes for multiple layer interconnection. Silicon is preferred because it is cheap and abundant. Aluminum and tungsten are chosen because they have adequate electrical conductivity and they can be made not to diffuse into the substrate during the many annealing operations inherent in the IC manufacturing process.

However, because the electrical conductivity of aluminum and tungsten is limited, the lines and plugs must be made thick enough to ensure minimal resistance to electric current between components and between levels. The relative large size of these conductors has become an issue for IC designers and fabricators interested in placing a greater density of circuit elements on an IC. In order to achieve greater performance from ICs, the lateral dimensions of the circuit elements must be reduced. This reduction in IC element size has two detrimental effects on the resulting IC. First, it increases the resistance of the metal interconnects. Second, it increases the aspect ratio of the via holes, making them more difficult to fill with the metallic material. Incomplete filling of the via holes exacerbates the problem of high resistance. Today, there is often not enough space in the lateral direction on an IC chip to accommodate large aluminum conductors. Additionally, the size of the via holes, when filled with tungsten, limits the number of levels in the IC.

Copper has attracted widespread interest in the semiconductor processing field as an alternative metallization material. Because of copper's greater electrical conductivity, copper conductors impose less resistance to the flow of electrons than aluminum or tungsten conductors having equivalent dimensions. In principle, smaller conductor lines should be feasible with copper to carry the same amount of current as aluminum or tungsten. Thus, the goal has been to achieve a tighter packing density per level, or reduce the number of metallization levels, using a copper interconnect strategy. Also, copper has superior resistance to poisoning due to electromigration from adjoining layers than aluminum, which also should make it a more reliable conductor. Therefore, copper has represented an attractive candidate for back-end-of-the line metallization, among other things.

However, a practical copper interconnect strategy for semiconductor devices has faced several problems. For instance, copper is susceptible to corrosion because it does not form a native self protective oxide surface film. Also, the electrochemical activity of copper is conducive to corrosion. As a consequence, adequate precautions are needed to protect the copper surface during polishing, cleaning and post-processing operations. However, as an even more notable problem of current interest, copper has a tendency to diffuse relatively easily at elevated temperatures into silicon. The copper which migrates into the silicon tends to produce deep-level defects, which can severely degrade the electrical characteristics of the devices. The probability of this problem arising is heightened due to the fact that ICs must be annealed several times during the fabrication process.

As efforts to impede the diffusion of copper into silicon and other adjacent materials, a variety of materials has already been proposed and used to form diffusion barriers and/or encapsulants for copper conductors. Previous copper barriers are described, for instance, in U.S. Pat. Nos. 5,151, 168 (Gilton et al.), U.S. Pat. No. 5,695,810 (Dubin et al.), and U.S. Pat. No. 5,824,599 (Schacham-Diamand et al.). Currently, a special need exists for suitable barrier films for copper-filled damascene lines. That is, as known, copper is relatively difficult to etch so its implementation in interconnect schemes generally requires additive patterning, such as damascene patterning, in lieu of subtractive processing.

Among the barrier materials under development within the semiconductor industry, nitrides or silico-nitrides of the transition metals titanium, tantalum and tungsten (e.g., TiN, TaN, WN, TiWN, TiSiN, and TaSiN) are prevalently used. The thickness of the metal-nitride barrier layer required to stop copper diffusion into silicon effectively is in the range of tens to hundreds of nanometers, or hundreds to thousands of Angstroms (A). As shown in FIG. 2, which is based on published Semiconductor Industry Association data, presently achievable effective diffusion barrier thicknesses are generally in the 200–250 Å range for tantalum nitride, for example, although barrier film thicknesses for metallic copper that are smaller than that have been suggested in the prior art (e.g., see U.S. Pat. No. 5,824,599 to Schacham-Diamand et al.). A thick barrier layer can frustrate the advantage of using copper interconnects. Therefore, very thin barrier layers for copper are needed which still can maintain barrier efficacy even as the circuit feature sizes inexorably continue to shrink.

Another practical problem associated with implementing copper interconnects arises from the present state-of-the art wafer technology. Wafers for processing, ideally, would be atomically smooth, or equivalently have a perfect two-dimensional surface. This requirement typically is not completely met, i.e., it is not generally satisfied for the entire surface area of a standard 3 inch (7.6 cm) silicon wafer. In practice, microscopic steps and terraces of height more than one atomic layer usually exist and occur on any wafer that is manufactured from bulk crystals. In addition, the crystal orientation of the wafer generally is not perfect, as consequently there will be mis-oriented grains and grain boundaries that extend to the surface of the wafer. These imperfections on the wafer will tend to undermine conventional atomic diffusion barriers as they provide pathways for the diffusion of the copper atoms.

The problem of diffusion exists not only in the case of copper metallization on silicon, but also in the case of copper metallization on other single- and polycrystalline semiconductor substrate materials such as gallium arsenide, silicon carbide, germanium, and so forth. Also, copper diffusion or drift into insulating or dielectric materials, such as $SiO_2$, can result in short circuits, especially in dense arrays of IC components. Diffusion is also a problem with other high conductivity metallization materials such as gold, silver, and platinum.

As can be appreciated from the foregoing, a barrier film is needed which is extremely thin, yet permits metallization using copper and other high conductivity metallic conductors which would otherwise have a tendency to diffuse into a substrate formed of a semiconducting material or an insulating material. It is further desired to improve electronic and electro-optic devices by making it possible to achieve one or more of the following desirable characteristics: increased component density in large scale integration, reduced heat dissipation, increased speed of operation, and a decreased number of metallization levels.

SUMMARY OF THE INVENTION

In accordance with this invention, an epitaxial barrier material provides not only a unique growth medium for growing single crystal structures of elemental metal thereon, but also provides an effective diffusion barrier at extremely thin thicknesses against migration of metal atoms from a conductor structure into an adjacent substrate. Moreover, the single crystal structures of the elemental metal are firmly attached to the barrier material to provide a stable and reliable metallization and/or contact scheme.

This invention is particularly advantageous for forming electrical conductor structures from single crystal, transition metals, in which the conductor structures can be layers, fines, filled trenches, contacts, bonding pads, and/or via plugs, and the like. For purposes of this invention, the "transition metals" are the elements of subgroups IIIB, IVB, VB, VIB, VIIB, VIII and IB in periods 4–7 of the Periodic Table (Long Period Form), and preferably those of subgroup IB of the Periodic Table (i.e., copper, silver, gold), as well as platinum. These metals are highly attractive for interconnect strategies on account of there intrinsic low resistivity and high reliability characteristics.

The present investigators have discovered that barrier materials meeting the purposes and objectives of this invention include certain epitaxial metal halides, which can behave as a solid state surfactant, i.e., a low surface energy material layer that "wets" two materials that do not normally "wet" well. For instance, although the present investigators have observed that copper does not normally stick well to many insulators due to surface energy mismatches, among other things, the present invention embodies processing conditions that permits metal halides that can be epitaxially deposited, especially alkaline earth metal halides such as $BaF_2$, to be transformed into solid state surfactants for purposes of growing single crystal elemental copper on the metal halide with tack strengths sustainable for metallization post-processing and service.

This invention is also significant because of its applicability to metals such as copper, which are especially prone to migration into and contamination of semiconductor substrates such as silicon upon moderate heating, as the epitaxial metal halide material serves as a diffusion barrier at relatively thin thicknesses to the single crystal metal structure formed in contact therewith.

In one embodiment of this invention, a semiconductor device is fabricated by providing a heteroepitaxial barrier film derived from a suitable metal halide as described herein on a surface of a substrate material, and a metallic conductor having a tendency to diffuse into the substrate material is formed on the barrier film, in which the metallic conductor has a single crystal structure.

In one preferred method of this invention, the procedure involves the formation of a heteroepitaxial ("composite") barrier film and single crystal metal structure, in that order, on a substrate surface through a three-stage operation. In a first stage, a monolayer portion of the barrier material is first produced on the substrate surface by depositing a continuous coating of metal halide upon a clean, hot surface of a semiconducting substrate material under ultrahigh vacuum conditions of less than $10^{-11}$ Torr chamber background pressure, and then the metal halide vapor is discontinued while the coated substrate is heated for a time period such that the metal halide first reacts with the substrate material and dissociates. This forms an uncontaminated metal/substrate surface reaction product while releasing gaseous by-products formed of substrate atoms and halogen atoms of the metal halide compound. This surface reaction is self-limiting as it forms a monolayer of metal atoms derived from the metal halide that are tightly attached to the substrate surface as part of a uniform epitaxial surface reaction product. In a second stage, the vapor deposition of metal halide then is resumed under the ultra high vacuum conditions so that a single crystal homoepitaxial film portion of the barrier material, which is formed of the metal halide molecules of the desired thickness, is formed upon the monolayer portion of the barrier material. The monolayer (monoatomic) layer of metal atoms and the homoepitaxial film of metal halide together provide a heteroepitaxial, composite barrier film. Then, in a third stage of the procedure, a metal is deposited upon the heteroepitaxial barrier film, and the surface of the barrier film that is heated either during the metal deposition or as a post-deposition anneal procedure to form a high quality, single crystal structure of metal directly on the barrier film. The heteroepitaxial barrier film can be formed in uniform thicknesses as small as several hundred angstroms thick, and preferably 100 Å or less, and even 75 Å or less, to provide extremely thin barrier film thicknesses for copper and similarly behaving metals in semiconductor device contexts. Among other things, these very thin, yet effective diffusion barrier thicknesses achieved by this invention supports tighter packing density objectives.

The metal halide compound used in forming the heteroepitaxial barrier film in the practice of this invention preferably behaves as a solid state surfactant described herein during metal deposition. Useful metal halides in this regard include barium, strontium, or cesium- halide salts that can be vapor deposited on a substrate. As indicated above, the elemental metal that can be deposited in the single crystal form on the metal halide barrier films formed by this invention are not particularly limited, but advantageously include metals which readily diffuse into silicon at moderately high temperatures such as copper, silver, gold, and platinum, singly or in combinations thereof.

Another advantage of the present invention, is that the heteroepitaxial barrier film conforms well to the surface contour of a substrate, whether the surface contour is very smooth or uneven, without leaving bare (uncoated) spots on the substrate surface, which increases the versatility of the invention. That is, the diffusion barrier layer of this invention can be implemented on not only semiconductor and electro-optic materials that have two-dimensional single crystalline surfaces, but it also has wider applicability encompassing substrate surfaces that contain crystalline defects (e.g., pits, crystalline mis-orientations, and steps). Further, the diffusion barrier layer also blocks the diffusion pathways on imperfect crystalline surfaces, and hence will be of more practical and immediate applicability with imperfect wafer surfaces, and hence the existing wafer technology. Also, in the case bulk metal halide crystals, the metal can be deposited directly on the crystal and processed according to this invention.

An important advantage of this invention is that a copper conductor can be formed on a very thin, yet effective, diffusion barrier film as a highly organized, single crystal (monocrystalline) structure. The single crystal morphology of the deposited copper yields even lower resistivity characteristics, as compared to polycrystalline forms of the metal, permitting even thinner interconnect lines. Consequently, the copper lines formed by this invention provide superior conductivity characteristics, permitting further line size reductions.

Furthermore, as the thickness of polycrystalline metal film gets smaller (e.g. on the order of approximately 400 Å or less), there is a general increase in its resistivity. This is because the conducting electrons are now scattered by the boundaries of the metal film. This is alleviated in the present invention by providing the metal film in a single crystalline morphology, in which case the electrons are scattered specularly at the surface. That is, even if the electrons are scattered, their energy and momentum are conserved because of the near-perfect atomic arrangement of the single crystalline film surface created by the present invention. Hence there is only minimal increase in the resistivity of the metal with a decrease in film thickness. Various other objects, details and advantages of the invention will be apparent from the following detailed description when read in conjunction with the drawings.

DETAILED DESCRIPTION OF THE INVENTION

Figure 1:
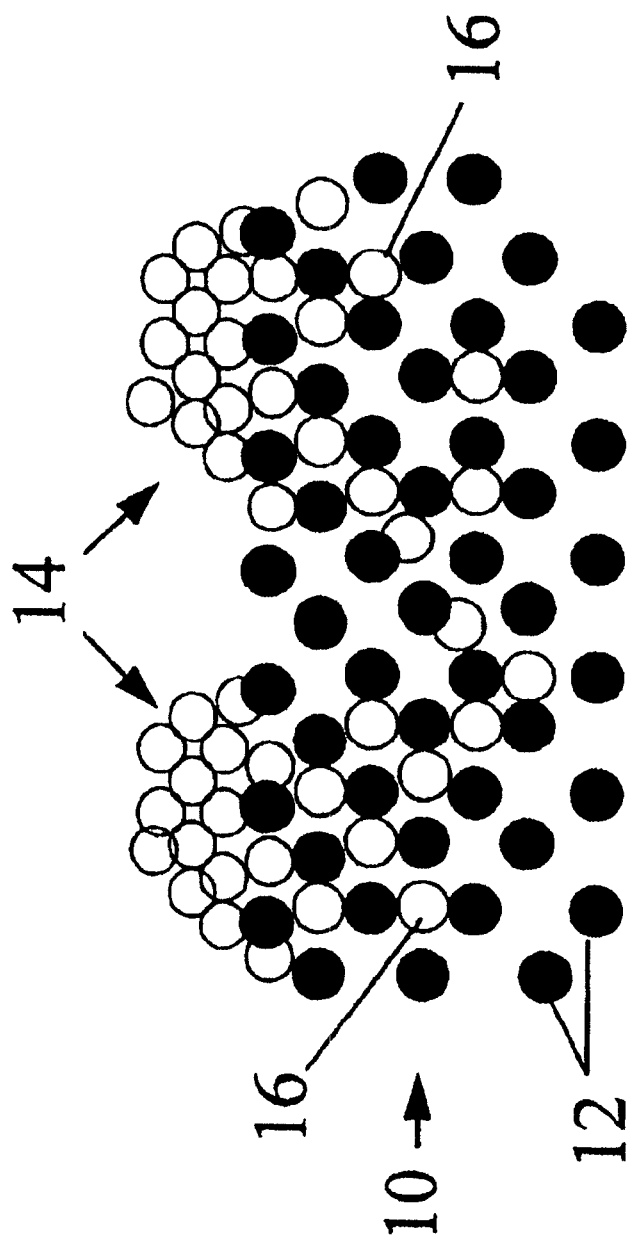
FIG. 1 is a schematic cross-section depicting diffusion of copper into a silicon substrate, where no diffusion barrier is present.
Figure 2:
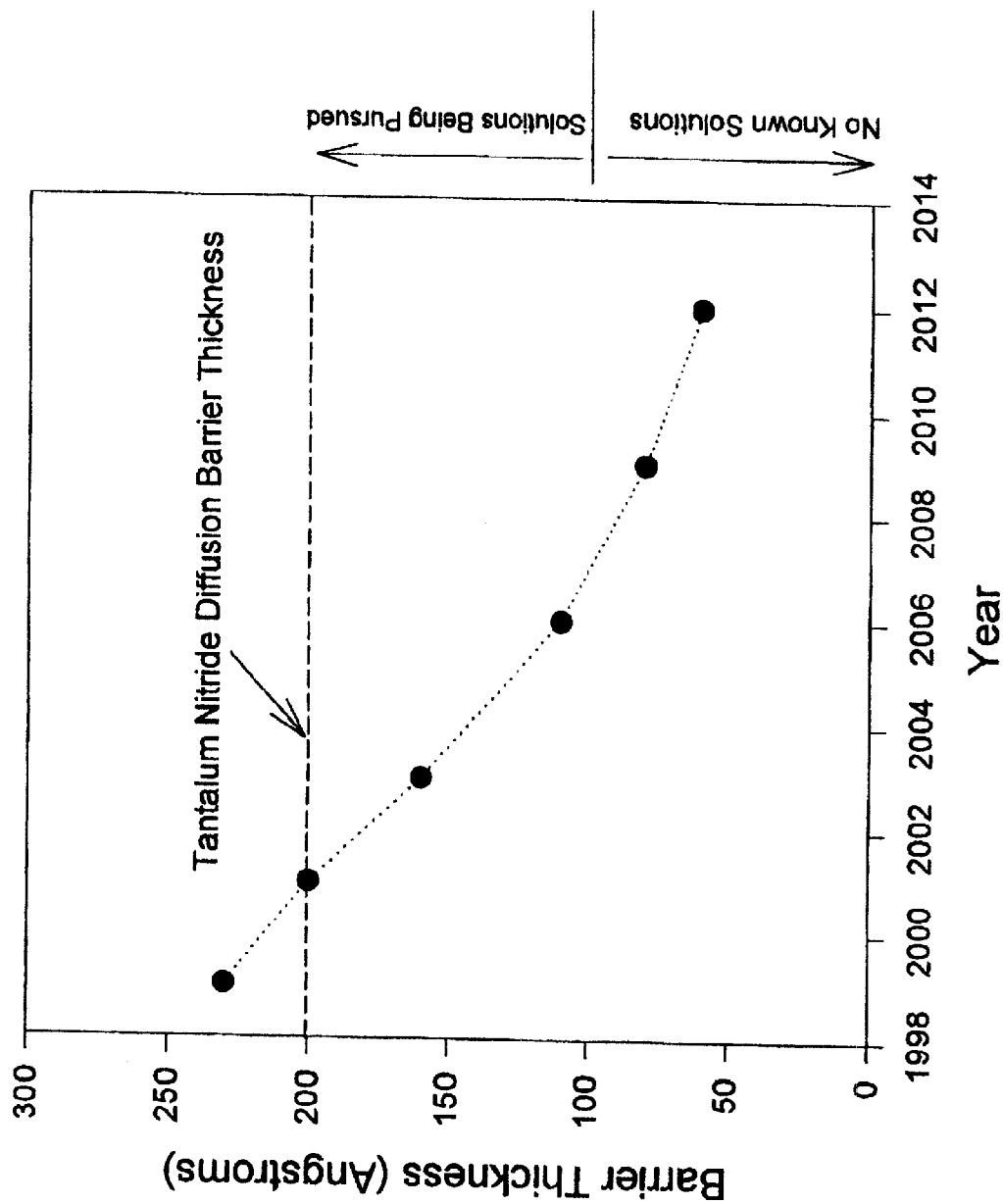
FIG. 2 is a graph illustrating the projected requirement in diffusion barrier thickness by the Semiconductor Industry Association.

FIG. 1 schematically illustrates an attempt at copper metallization of a silicon semiconductor substrate 10 without use of an effective diffusion barrier. However, it will be appreciated from the disclosure herein that this invention has broad applicability, and it is not limited to usages involving only silicon substrates. In any event, for this illustration, the substrate, which is made up of silicon atoms 12, has two laterally delineated copper interconnect strips 14 deposited on its surface. In the annealing process, copper atoms 16 tend to readily diffuse into the substrate, impairing its semiconducting properties, and usually rendering it totally inoperative, by effectively creating an electrical short circuit. Similar diffusion occurs at an interface between a copper conductor and a $SiO_2$ dielectric layer, for example in the case in which an attempt is made to deposit a conducting copper plug in a via hole in the $SiO_2$ layer. Drift of copper atoms through the $SiO_2$ layer impairs its effectiveness as an insulator and may have a serious adverse effect on the properties of the device.

As mentioned above, various prior attempts and proposals have been made to achieve a diffusion barrier to permit the use of copper conductors in semiconductor devices. This invention achieves that and other objectives by providing a unique growth medium for forming single crystal structures of metal on substrates surfaces with excellent tolerance of any microscopic substrate surface irregularities, such as pits, crystal surface defects or steps and so forth, while also providing an effective diffusion barrier against migration of atoms from a metallization layer into the adjacent substrate (e.g., a semiconductor, or low dielectric or insulation layer). Moreover, these salutary effects of the invention can be achieved at relatively thin barrier film thicknesses of several hundred Ångstroms or less, and even at thicknesses well below 100 Å including 75 Å or less.

Figure 3A:
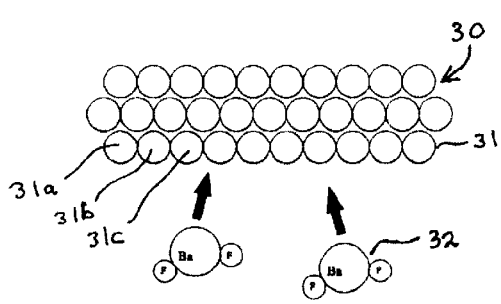
FIGS. 3A–3C are schematic diagrams illustrating the process of forming the diffusion barrier, and a metallization layer, onto a substrate by molecular beam epitaxy.
Figure 3B:
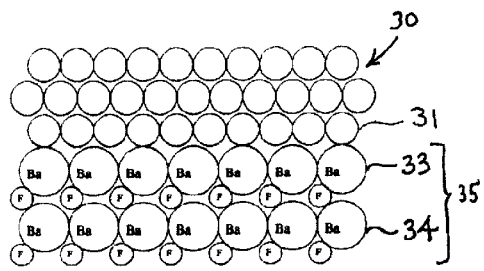
Figure 3C:
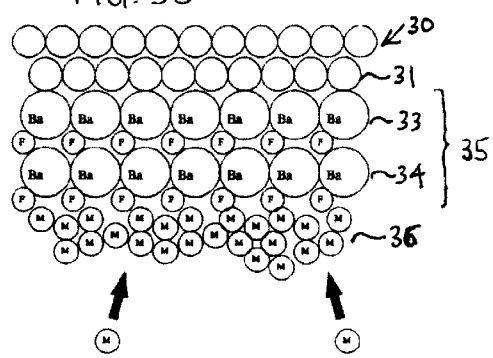
Figure 6:
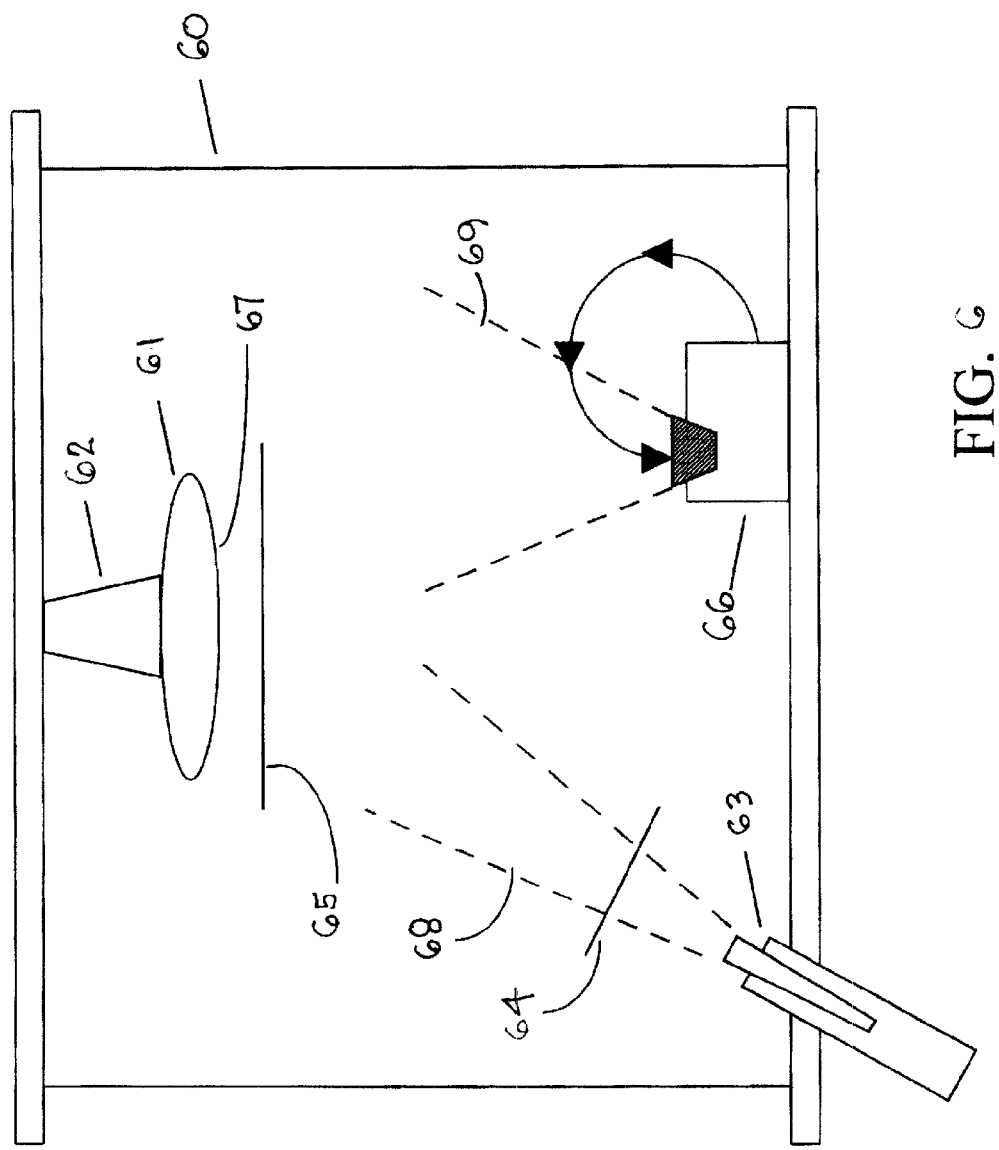
FIG. 6 is a schematic diagram of an ultrahigh vacuum apparatus within which the steps of the process of the present invention may be performed.

Referring now to FIGS. 3A–3C, which illustrate a process sequence of this invention, a silicon substrate and barium fluoride vapor source for forming an epitaxial barrier film are identified here for sake of the illustration, but the invention is not limited thereto as explained herein. In any event, a portion of an integrated circuit is schematically illustrated on an atomic level that comprises a silicon substrate 30 made up of silicon atoms including a surface layer 31. The single-crystal silicon substrate is placed inside a MBE deposition chamber, such as illustrated in FIG. 6 and described elsewhere herein. The silicon substrate is annealed to approximately 800–900° C. for one hour to remove the silicon dioxide passivation layer.

To form the heteroepitaxial barrier film, $BaF_2$ molecules 32 are directed and impinged onto the surface 31 of the silicon substrate 30, such as by MBE deposition. For FIGS. 3A–C, $BaF_2$ is used to illustrate the metal halide, and silicon is used to illustrate the (semiconductor) substrate, although other materials can be used as indicated elsewhere herein.

The silicon surface 31 to be used as the deposition substrate preferably, although not indispensably, has a highly planar, smooth surface to minimize the coating thickness needed to provide complete coverage thereof Deoxidation annealing, chemical-mechanical-planarization (CMP) polishing or ion milling can be used in a pretreatment of the silicon surface prior to deposition of the diffusion barrier to enhance the planarity and smoothness of silicon surface, if necessary. On the other hand, as will be described below, the inventive process itself provides some measure of in situ planarization of the silicon surface during MBE deposition.

In any event, in the first stage of the inventive process, the substrate is brought to an epitaxial barrier film deposition temperature of approximately 600° C. in an MBE deposition chamber which is trapped with liquid nitrogen to ensure a vacuum of $1\times10^{-11}$ Torr or less. $BaF_2$ is deposited on the hot clean silicon substrate under the ultrahigh vacuum conditions for approximately 1–3 minutes sufficient to completely and uniformly coat the substrate surface without leaving bare (exposed) spots on the substrate surface. Complete coating is indicated by the single crystal silicon RHEED pattern is replaced by a single crystal $BaF_2$ RHEED pattern. The $BaF_2$ flux is halted and the coated substrate is annealed at approximately 700–900° C. for approximately one hour until a good barium silicide RHEED pattern appears. During this stage of processing, the $BaF_2$ molecules react with silicon atoms $31a$, $31b$, $31c$, and so forth, at the surface 31 of the silicon substrate 30. The Ba-F and silicon-silicon bonds at the surface of the silicon substrate are broken. The free silicon and fluorine atoms at the vicinity of the interface where the barium fluoride molecules are contacting the silicon surface 31 then combine to form volatile silicon-fluoride compounds ($SiF_x$), not shown, such as $SiF_2$ or $SiF_4$, which escapes from the silicon substrate surface 31, and it is extracted from the MBE chamber via vacuum.

The monolayer of barium atoms forms a template layer on the silicon substrate as a reaction product (barium silicide) of the barium atoms and the silicon atoms at the surface of the silicon substrate. By comparison, if the substrate 30 instead is GaAs, the escaping by-product gas would be GaF. This etching-like effect upon the surface silicon atoms serves to effectively smoothen the silicon surface. In any event, as illustrated in FIG. 3B, the barium atoms left behind bond with dangling bonds of the surface silicon atoms, forming monolayer 33 as a two-dimensional array of barium metal atoms having a thickness of one atomic layer (i.e., a monoatomic layer), where the barium atoms are tightly bonded to atoms of the substrate surface. This barium fluoride film deposition step proceeds for a sufficient duration of time to form a continuous or essentially continuous layer of barium atoms across the surface of the silicon substrate without leaving any bare spots, which can be monitored by observing the RHEED pattern. The formation of the barium monolayer layer in this stage is self-limiting, and is not affected by the amount of $BaF_2$ deposited in the first stage. Of course, the more extensive the $BaF_2$ deposition, the longer the anneal time needed to eliminate the excess metal halide and leave only the barium monolayer on the silicon substrate. The barium fluoride flux used should be extremely low, e.g., on the order of $1 \cdot 10^{-12}$ molecules/$cm^2$/sec. This is to allow enough time for the formation of an atomic layer of barium on the wafer surface before the formation of the epitaxial barium fluoride portion of the barrier film, the latter of which will be decomposed as described above.

As illustrated in FIG. 3C, once complete coverage of the silicon substrate 30 with the monolayer of barium atoms 33 is achieved, barium fluoride 34 vapor deposition via MBE is resumed from the molecular beam source. To accomplish this, the substrate is brought to an epitaxial barrier film deposition temperature of 600° C. in the MBE deposition chamber trapped with liquid nitrogen to ensure a vacuum of $1\times10^{-11}$ Torr or less. As illustrated in FIG. 3C, this subsequently introduced barium fluoride adheres to the previously formed barium monolayer 33 and grows epitaxially thereon to form a homoepitaxial film portion 34. Deposition methods other than MBE also can be used such as physical and chemical vapor deposition, RF Sputtering, wet chemical processes, and liquid phase epitaxy.

While only one layer 34 of barium fluoride is illustrated as deposited upon the monolayer 33 for sake of simplifying the illustration, it will be understood that the amount of subsequent deposition of epitaxial barium fluoride on the barium monolayer can be controlled to deposit any thickness desired for the homoepitaxial regime 34 of the barrier film 35 being formed. There is no practical limit on how thick the overdeposit of barium fluoride can be that is formed over the barium monolayer. It is advantageous to limit the vapor deposition of the homoepitaxial portion 34 of the film 35 to provide a thickness of less than several hundred angstrom to facilitate reduction of the packing density of the device being fabricated. On the other hand, if the substrate surface is uneven, the epitaxial barrier 35 must also be thick enough to ensure a complete coverage of the substrate. In any event, a heteroepitaxial film 35 is formed on the substrate surface 30 comprising a monolayer 33 of metal (e.g., Ba) atoms as an interaction regime attached directly to the substrate surface 31 and a homoepitaxial regime 34 comprised of oriented molecular metal halide (e.g., barium fluoride) formed, in turn, on the monolayer 33. The homoepitaxial regime 34 of $BaF_2$ of the heteroepitaxial film 35 replicates the crystal orientation of the substrate. For instance, the homoepitaxial regime 34 of $BaF_2$ is (100)-oriented on silicon (100) or GaAs (100), (111)-oriented when the substrate is silicon (111) or GaAs (100), and (001)-oriented on silicon (001). Similarly, the single crystal grown on the epitaxial barrier film assumes a crystal orientation identical to that of the substrate and the epitaxial barrier film.

XPS measurements have confirmed that barium atoms have the two above-mentioned different chemical states, i.e., the interaction (metal monolayer) and the homoepitaxial regimes, in the epitaxial barrier film present at this stage of processing. The relative abundance of these two states has also been determined by XPS. The results of these analyses confirm that $BaF_2$ first reacts with the silicon surface during initial MBE deposition at the silicon surface and dissociates, releasing a gaseous silicon-fluorine compound. This reaction is self-limiting, resulting in a barium monolayer that enables subsequent $BaF_2$ molecules to form an epitaxial (111)-oriented film on the silicon surface. Then, a post-growth anneal affects evaporation of the barium fluoride deposited on the monolayer.

An alternative approach to forming the barrier film is to increase the barium fluoride flux after the appearance of the first barium fluoride RHEED pattern, without discontinuing the barium fluoride deposition for an intermediate anneal procedure. RHEED patterns obtained according to this alternate approach have indicated that good epitaxial quality barium fluoride can be formed in this manner as well. The initial and retained epitaxial barium fluoride layer ensures in turn that subsequent barium fluoride deposited thereon will also be of good epitaxial quality. This alternative is preferred when the desired thickness of the barium fluoride layer becomes large, for example, more than 100 Ångstroms.

However, in terms of overall structural integrity of the heteroepitaxial (composite) barrier film, the first-mentioned embodiment where a distinct metal monolayer is formed by deposition and anneal processing before forming the permanent metal halide portion of the barrier film is preferred because a well-developed barium monolayer will enhance the epitaxial quality of the barium fluoride layer grown thereon, and, in turn, this enhances the quality of the crystal structure formed in the deposited metal. For manufacturing purposes, the choice of these slightly different methods will depend somewhat on how the art of deposition is practiced, and on performance level of the barrier desired. In any event, the $Ba/BaF_2$ composite film, i.e., the heteroepitaxial barrier film, will act as the diffusion barrier material between silicon and any subsequent metallization layer deposited upon it. After the barrier film has been formed, copper or other interconnect metal can be deposited on it.

Referring again to FIG. 3C, the deposition of the metal 36 is preferably accomplished using a deposition process, such as MBE or CVD, that are free of kinetic ion bombardment of the workpiece, as the kinetic ions might disrupt the solid state surfactant phenomenon associated with the epitaxial barrier film described herein. The crystalline structure of the metal 36, especially copper, is also a subject of this invention. This is because the metal 36 deposited on the barium fluoride is single crystalline in structure.

In one mode of this invention, the single crystalline copper layer is achieved by maintaining the substrate at a temperature of 375° C. or higher during the metal (e.g., copper) deposition. Alternatively, the metallization can be carried out on the heteroepitaxial barrier film at room temperature, and then a post-deposition annealing procedure is carried out to transform the deposited metal into a single crystal morphology. Although either mode of metal deposition mentioned above yields the desired single crystal metal, for copper metal, deposition of the copper on the barrier film and substrate in the mode using a higher substrate temperature during deposition tends to yield a metal layer of the highest quality.

In any event, the heating temperature for the copper or other deposited metal, whether applied in situ during metal deposition or as a separate post-treatment anneal as described above, must be high enough to permit the copper to arrange in a predominantly single crystal morphology. For copper metallization structures, this lower temperature limit is approximately 375° C. where the barrier film is barium fluoride. In general, as the annealing temperature is increased from approximately 375° C. approximately 400° C., the single crystal morphology of the copper becomes more ordered, and the result generally plateaus for even higher temperatures. Therefore, the upper temperature limit for annealing the copper can be conducted at up to 500° C., or even higher, and is only limited by practical concerns regarding the materials. In theory, the pressure condition in the metal deposition chamber may have an upper limit where it might disturb the solid state surfactant phenomenon of the heteroepitaxial layer.

The deposited copper or other transition metal formed on the barrier film is occasionally referred to herein as "elemental" copper or metal because the metal atoms are deposited in the free state on the metal halide portion of the barrier film. That is, the transition metal atoms are not deposited as a compound (e.g., a metal salt or metal oxide). Consequently, the transition metals generally are formed as the electrical conductor structures in pure or essentially (very high purity) forms of the metal. Transition metals, as defined herein, include, e.g., Cu, Ag, Au, Pt, Pd, Ni, Co, Fe, Mn, Cr, Mo, W, V, Ta, Zr, Ti, and Y. The transition metal generally comprises all or approximately 100%, by weight, of the total content of the conductor structure deposited on the barrier film, although some trace amounts of impurities may be present in the conductor, such as described in the examples herein.

Alternatively, in another embodiment, the conductor structures can be formed on the barrier film as metallic mixtures, solid solutions, alloys, intermetallics, doped layers, and the like, of a transition metal with a different transition metal, or with other metals and/or dopants. However, no materials or amounts thereof can be present in the deposited conductor structure which would frustrate the formation of a single crystal structure in the conductor structure. The single crystal morphology of the conductor structure can be confirmed by analytical methodology such as described elsewhere herein.

Additionally, the MBE deposition of the heteroepitaxial barrier film and the metallization can be performed in the same processing chamber without breaking the vacuum between the two procedures. Alternatively, the MBE deposition can be performed in a first processing tool, after which the vacuum is broken, and the workpiece is then transferred to another processing tool (e.g., MBE chamber, CVD chamber, and so forth) for separately performing the metallization. In the latter case, the homoepitaxial portion of the heteroepitaxial barrier film can serve as a protective coating over the monolayer portion of the heteroepitaxial film during such transit between separate processing tools. The wafers also can be transferred between separate processing chambers using an ultrahigh vacuum transfer system such as those systems conventionally known in the semiconductor fabrication arts.

Figure 4:
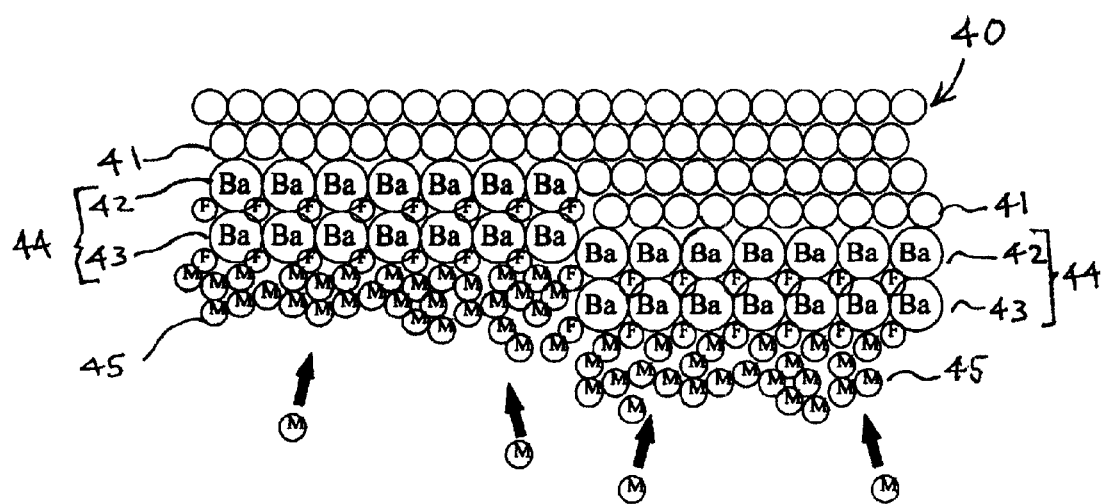
FIG. 4 is a schematic diagram illustrating a process of forming the diffusion barrier, and a metallization layer, onto a substrate having an uneven surface according to another embodiment of this invention.

Referring to FIG. 4, another significant advantage of the invention is its applicability to processing on uneven, irregular or stepped substrate surfaces 41 of a substrate 40, or substrate surfaces having other defects in the first or several atomic layers of the substrate surface. That is, the epitaxial barrier layer 44 (monolayer 42 plus homoepitaxial layer portion 43) and single crystal metal 45 grown thereon conform well to an uneven surface contour presented by a substrate 40 without leaving exposed bare spots on the substrate surface 41. For this embodiment, the same processing protocol is used as applied to the FIGS. 3A–3C embodiment involving an even substrate surface.

Figure 5:
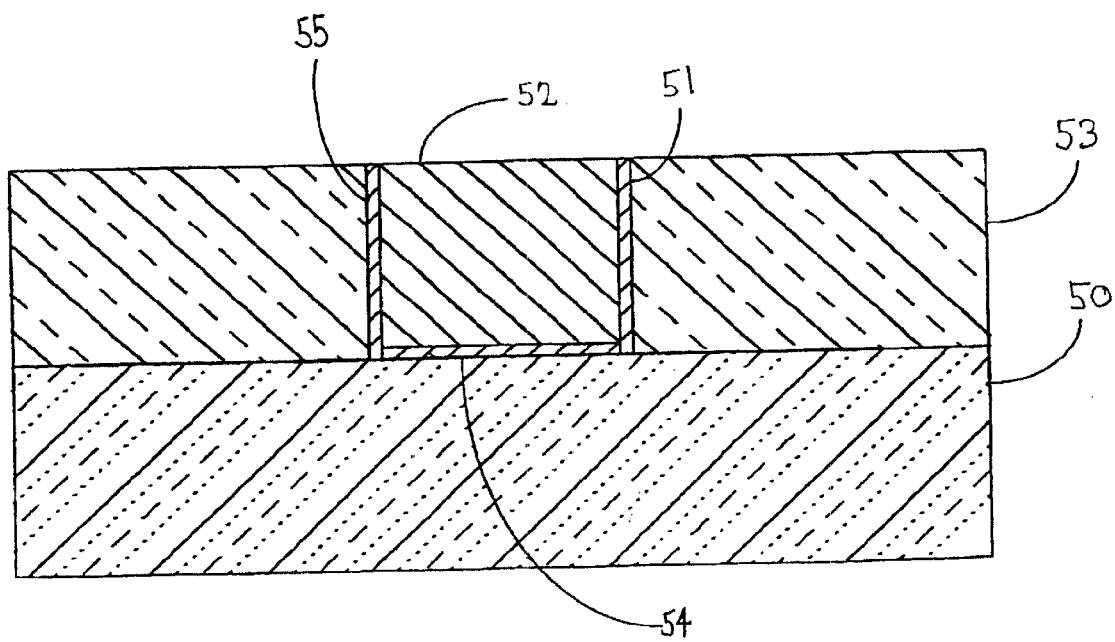
FIG. 5 is a schematic cross-sectional view showing a diffusion barrier used in accordance with another embodiment of the invention preventing diffusion of a single crystal copper line deposited in a via opening (trench) into an underlying silicon substrate or into an adjoining dielectric layer overlying the substrate.

As illustrated in FIG. 5, the diffusion barrier and single crystal metal film, such as single crystal copper, produced in accordance with the invention can be used not only to prevent diffusion of conductor metals into a semiconductor substrate, but also to prevent diffusion of the conductor metal into an underlying substrate and laterally adjacent insulating or dielectric layer. In FIG. 5, layer 50 is a semiconductor substrate, for example, a semiconducting layer or wafer of silicon, and layer 53, which overlies layer 50, is a dielectric or insulating layer. A plug 52 of a metal, such as copper, is located in a via hole or trench 54 though dielectric layer 53. In this illustration, the plug 52 makes ohmic contact with an active region (not shown) in the surface of the semiconducting layer 50 through the very thin diffusion barrier film 51, where the single crystal metal 52 and thin diffusion barrier layer or film 51 are formed by the processing as described above. In this manner, the single crystal metal plug 52 can be used to conduct current between active areas (not shown) in the surface of the substrate layer 50 and another layer or metallization level (not shown) which is separated from layer 50 by dielectric layer 53. In the same process, the sidewalls 55 of the via hole 54 are lined with the diffusion barrier film 51, which prevents diffusion of the copper 52 into the dielectric layer 53. The protective diffusion barrier film also could be formed on top of a single crystal conductor structure of this invention in order to encapsulate the structure with the protective diffusion barrier film.

As will be apparent from FIG. 5, the minimization of the thickness of the side wall diffusion barrier 51 makes it possible to use copper for plug interconnections between different levels (layers) of a metallization scheme. The copper interconnects can be significantly narrower than tungsten interconnects having the same current capacity, and the diffusion barrier is also very thin. Therefore the use of the diffusion barrier in accordance with the invention as a liner for via holes in dielectric or insulating layers, can contribute significantly to the minimization of the lateral dimensions of an integrated circuit of which the elements shown in FIG. 5 are a part. Because the diffusion barrier 51 is very thin, it permits the use of via holes 54 of relatively low aspect ratio, making them easier to fill with conducting metal and eliminating voids which result in failures or rejection of ICs. FIG. 5 indicates the applicability of the present invention to copper damascene patterning strategies.

One suitable apparatus for depositing the metal halide used for forming the diffusion barrier film and the transition metal is a molecular beam epitaxy (MBE) system, such as depicted in FIG. 6. A substrate 61, e.g., a silicon wafer, is supported on a rotating holder 62 within a conventional MBE deposition chamber 60. The deposition chamber 60 can be a commercial molecular beam epitaxial (MBE) deposition chamber model Semicon V80H made by Vacuum Generators. The deposition chamber is illustrated in simplified form. Not shown are provisions for raising the temperature of the substrate to annealing temperatures and for evacuating the chamber, and those entail conventional equipment. Also not shown is a conventional Reflective High Energy Electron Diffraction (RHEED) diagnostic system directed toward the substrate 61. A diffusion barrier compound effusion cell, for example a barium fluoride, strontium fluoride, cesium fluoride or the like effusion cell, is provided at 63, and has a shutter 64. A shutter 65 is also provided for the silicon wafer 61. A separate electron beam source for forming the metallization layer, e.g., copper, is shown at 66.

In the operation of the MBE deposition apparatus of FIG. 6, the substrate 61 is placed inside the chamber 60 and positioned by rotatable holder 62 and the chamber 60 is evacuated, using ion pumps and liquid nitrogen trapping to achieve a high vacuum. The substrate 61 is vacuum annealed to remove any passivation layer by deoxidation, for example silicon dioxide in the case of a silicon wafer. The temperature of the substrate 61 is then reduced to a suitable deposition temperature, and the effusion cell 63 is heated while the substrate 61 is mechanically rotated. The electron beam of a RHEED diagnostic system is focused onto the substrate 61 and the RHEED pattern is monitored. When the RHEED pattern corresponding to the single crystal substrate surface appears (indicating complete removal of the passivation layer) on the RHEED screen, the shutters 65 and 64 in front of the substrate holder 62 and the effusion cell 63, respectively, are opened to allow metal halide vapor molecules to impinge on the substrate surface 67. Deposition of the metal halide vapor 68 onto the silicon surface 67 begins, and is allowed to continue until the single crystal silicon RHEED pattern disappears and is replaced by a pattern corresponding to a single crystal layer of the metal halide compound. Deposition is halted by closing the substrate and effusion source shutters 65 and 64, respectively. By this juncture, a heteroepitaxial film derived from the metal halide molecules is situated on the substrate surface 67, although the nature of the interface is more complicated as will become apparent from later descriptions herein. During the deposition of the metal halide 68 on the substrate 61, the substrate 61 should be at a temperature in the range from approximately 500° C. to 800° C., and preferably at approximately 600° C., though the temperature will vary depending on the particular substrate and the processing tool. The background chamber pressure within the deposition chamber 60 should be $10^{-11}$ Torr or less, more preferably $10^{-12}$ Torr or less during the formation of the heteroepitaxial barrier film. The time required to achieve adequate deposition of the metal halide sufficient to form the homoepitaxial portion of the heteroepitaxial film on the substrate is typically 15 to 20 minutes, but is not limited thereto depending on the thickness desired.

The metal is then deposited on the epitaxial barrier film using the electron beam source 66 with substrate heated to at least 375° C. during or after the metal 69 is deposited, in which the background chamber pressure condition need be only a vacuum sufficient to prevent contamination of the workpiece.

The general nature of the invention having been set forth, the following example is presented as a specific illustration thereof. It will be understood that the invention is not limited to the following specific example but is susceptible to various modifications that will be recognized by one of ordinary skill in the art.

EXAMPLE 1

A barium/barium fluoride (Ba/BaF$_2$) composite barrier film was grown on a silicon (100) wafer using molecular beam epitaxy (MBE), followed by formation of a single crystal metallic (elemental) copper layer on the metal halide (surface) portion of the barrier film. The films were grown inside a commercial MBE deposition chamber made by Vacuum Generators (model VG Semicon V80H). The MBE system above has both Knudsen cells and e-beam sources for the barium fluoride, and a separate e-beam source inside the chamber for the copper, and a 30 kV RHEED system to monitor the film structure during film deposition. The substrate heater is capable of holding up to 3 inch (7.6 cm) diameter wafers and control the substrate temperature to within ±0.1° C. at 1000° C. and a maximum deviation of the temperature across the substrate of ±0.1° C. All temperature measurements are made from a noncontact thermocouple gauge, namely, an optical pyrometer having an accuracy of ±0.5° C.

A silicon (100) wafer was polished and cleaned using standard industry procedures. The silicon substrate was loaded into the MBE deposition chamber maintained at a chamber pressure of approximately 3×10$^{-10}$ Torr. The silicon substrate was heated to 800° C. for one hour to remove the silicon dioxide passivation layer as indicated by the RHEED pattern appearing "streaky" denoting a good two-dimensional pattern.

A BaF$_2$ effusion cell was heated to 1050° C. While the substrate holder was mechanically rotated, the electron beam from a RHEED diagnostic system was directed toward the substrate. The beam was focused until the RHEED pattern of a single crystal silicon surface appears on the RIHEED screen. The substrate was then brought to an epitaxial insulating film deposition temperature of 600° C. in the MBE deposition chamber, and the deposition chamber had been trapped with liquid nitrogen so as to ensure a vacuum of $1 \times 10^{-11}$ Torr or less throughout the epitaxial insulating film deposition. The shutters in front of the substrate holder and the effusion cell were then opened for approximately 2 minutes to allow $BaF_2$ molecules to impinge on the substrate surface, and the flux gauge reading was approximately $9 \times 10^{-10}$ Torr. After halting the deposition by closing the substrate and $BaF_2$ effusion source shutters, the substrate was maintained at 600° C. in the absence of the $BaF_2$ flux for one hour until the single crystal silicon RHEED pattern disappeared and was replaced by a good barium silicide RHEED pattern.

The shutters were reopened to deposit $BaF_2$ at a rate of approximately 5 Å/minute for approximately 20 minutes, and the single crystal barium silicide RHEED pattern was replaced by a single crystal $BaF_2$ RHEED pattern. The flux gauge reading was approximately $9 \times 10^{-10}$ Torr during the $BaF_2$ deposition. The resulting $BaF_2$ film had a thickness of approximately 100 Å.

Figure 7A:
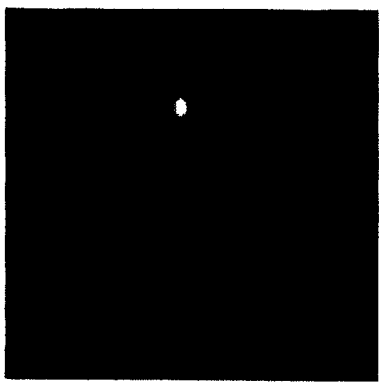
FIGS. 7A–7B are photographs providing Reflection High Energy Electron Diffraction (RHEED) patterns of the copper surface of a copper film formed on a diffusion barrier disposed on the surface of silicon according to the invention.
Figure 7B:
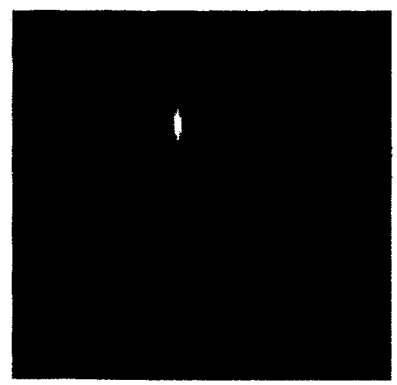

The barrier film coated-substrate was allowed to cool down to room temperature. A copper evaporation source was turned on in the MBE chamber, where the source is an electron beam source operated at a beam energy at 9 KV and beam current 0.2 mA. The beam energy and current were not crucial parameters, and depend on the particular e-beam source used. Attached Image (A) in FIG. 7A shows the RHEED pattern of this polycrystalline Cu film formed. The substrate temperature was then raised to 400° C., and then maintained at that temperature for 4 hours. The chamber pressure during heating was approximately $5 \times 10^{-11}$ Torr, and it was kept high enough to prevent contamination of the wafer. A copper RHEED pattern appeared upon completing the heating step which indicated that a single crystalline (epitaxial) copper film had been formed, as shown by Image (B) of FIG. 7B visually shows the streaky pattern associated with this two-dimensional monocrystalline film. Namely, FIG. 7B shows no scattering of the beam, unlike FIG. 7A.

An alternative copper deposition approach has also been confirmed as being suitable. In particular, the above sequence of steps was altered as follows. After completing the 20 minute deposition of $BaF_2$, on the barium monolayer formed on the silicon substrate, the substrate was instead cooled to 400° C., and maintained at that temperature under the mentioned ultra high vacuum conditions. Then the copper was deposited as described above on the hot surface of the coated substrate directly resulting in a RHEED pattern which was that of a single crystalline (epitaxial) Cu film and the same as FIG. 7B (Image (B)).

Characterization of Formed $Cu/BaF_2/Ba/Si$ structure:

The diffusion barrier performance relative to copper of the barrier film formed on Si according to the above first-mentioned manner (i.e., the copper deposition at room temperature followed by 400° C. anneal) was investigated by XPS chemical analyses with depth profiling by ion-milling to probe the behavior of the atomic species in the resulting metallized structure. The result is shown in the attached FIG. 8A. In this figure, the left side of the horizontal axis of the graph represents the surface of the Cu film and the depth values in the graph are reported starting from that point of reference and proceed through the barrier film to the silicon substrate. The vertical axis represents the Relative Signal.

Figure 8A:
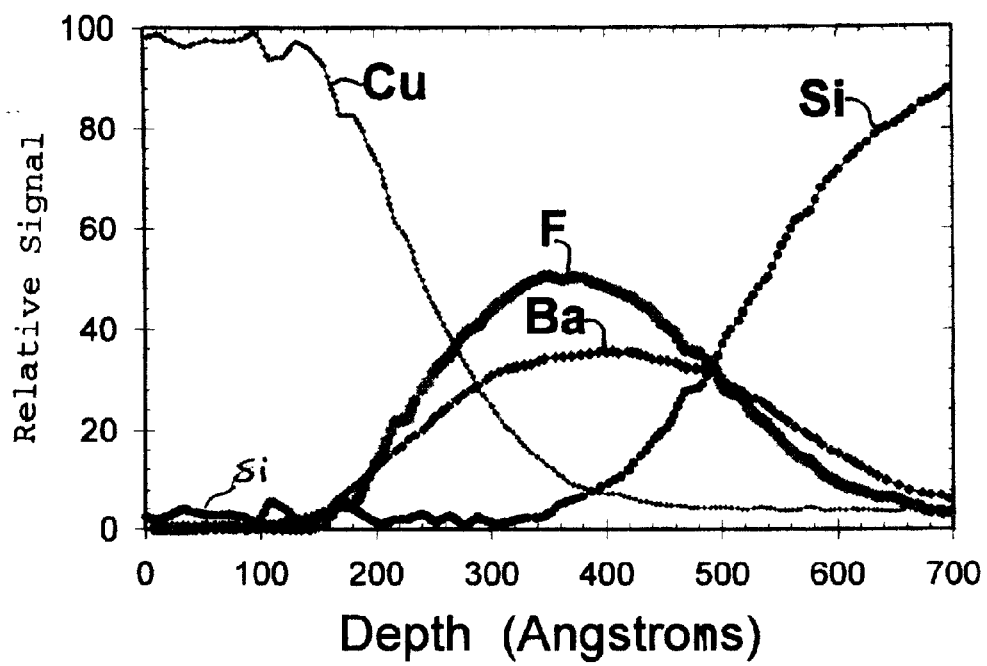
FIGS. 8A–8B are x-ray photoelectron spectroscopy (XPS) chemical analyses graphs showing the interfacial chemistry of a metallized substrate having a diffusion barrier according to this invention.

It is apparent from FIG. 8A that the Cu signal had receded to very low level in the middle of the $BaF_2$ layer. Ideally, a zero Cu signal in the $BaF_2$ film would be observed. The fact that the Cu signal was not zero is thought to be an inadvertent effect of the ion beam used in the XPS chemical analyses, i.e., the impinging ions kept pushing some copper atoms located at the interface with the surface of the barrier film into the barrier film. The result is a persistence of the Cu signal that is not indicative of the profile of the actual manufactured product.

Figure 8B:
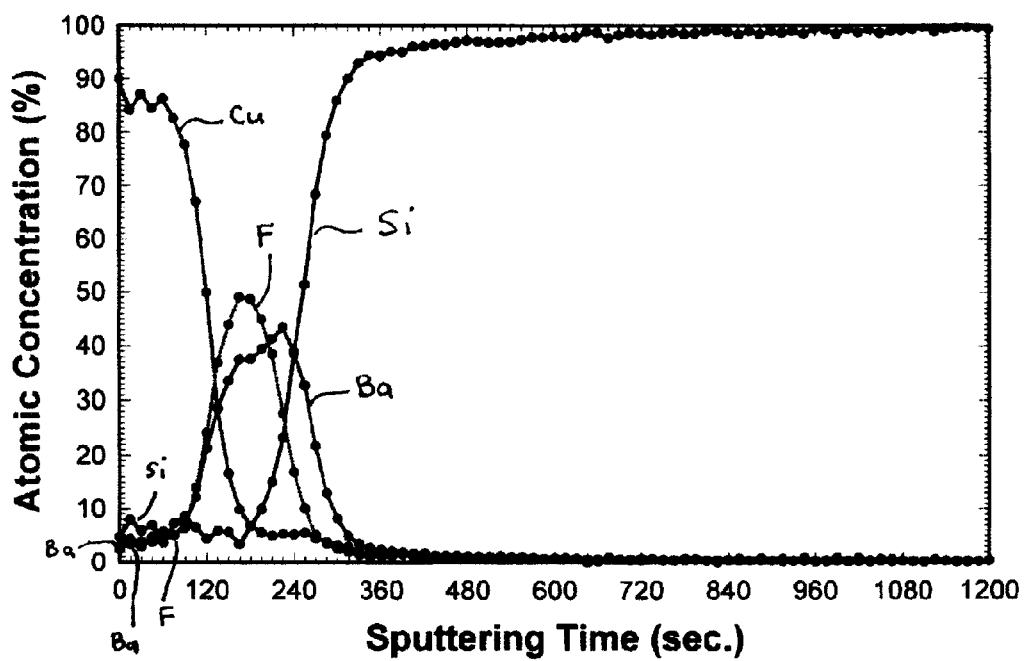

A repeat run of the example for making the metallized substrate as described above yielded measurement results with even better resolution (see FIG. 8B). For the repeat run, the test results shown in FIG. 8B indicate that the Cu is bound to the Ba, as indicated by the concurrent "bumps" (at around 200 sec on the x-axis) and drop-off (at around 270 sec on the x-axis) of the Ba and the Cu signals. That shows the Cu signal tracked the Ba signal, and did not track the Si signal. Those results are considered to be indications of the effect of ion-milling associated with the XPS chemical analyses and also of close-binding of the Cu to the Ba atoms.

Copper films were also grown on barium fluoride grown on silicon have a (111) crystallographic direction as determined using x-ray diffraction spectroscopy. The results were similar to those achieved for the (100) oriented silicon substrate described above. Namely, all results on silicon have indicated that the copper film always follows the same crystallographic direction of the barium fluoride.

EXAMPLE 2

A barium/barium fluoride ($Ba/BaF_2$) composite barrier film also was grown on a single crystal gallium arsenide (001) wafer using molecular beam epitaxy (MBE), followed by formation of a single crystal metallic (elemental) copper layer on the metal halide (surface) portion of the barrier film.

To accomplish this, first, a barium fluoride film was deposited on the gallium arsenide substrate using the basic procedure described in U.S. Pat. No. 5,932,006 (see Example 1 therein) except that the (100) oriented single crystal GaAs substrate was replaced by a (001) oriented single crystal GaAs substrate for this example, which teachings are incorporated herein by reference.

Figure 9:
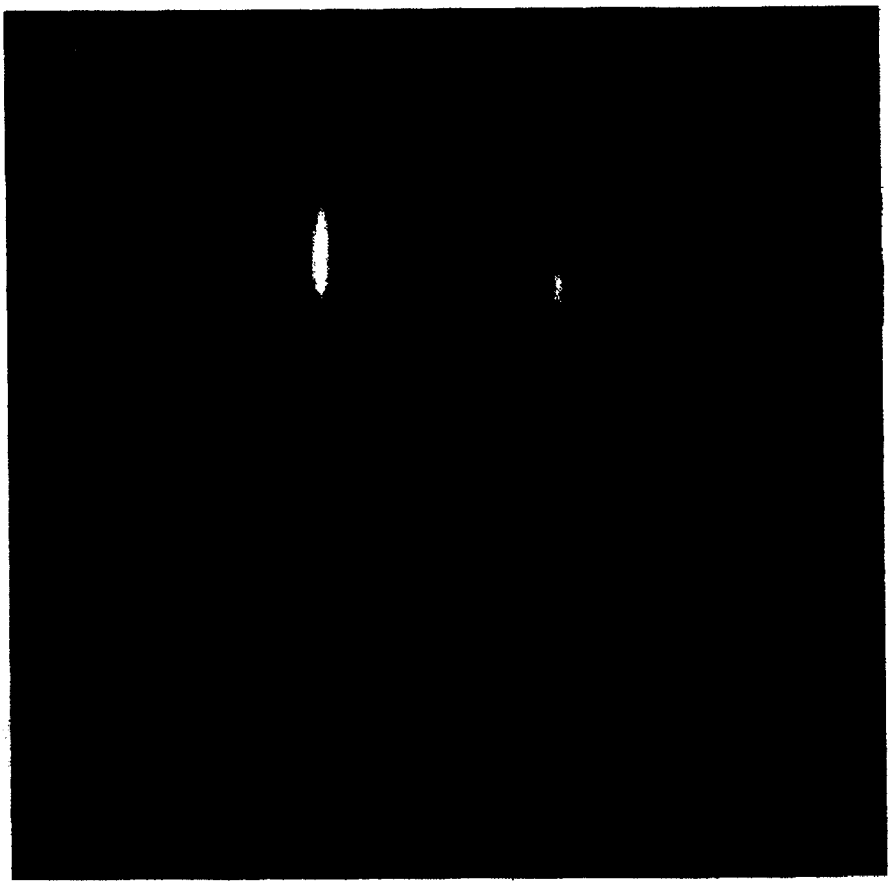
FIG. 9 is a photograph providing a Reflection High Energy Electron Diffraction (RHEED) pattern of the copper surface of a copper film formed on a diffusion barrier disposed on the surface of gallium arsenide according to another embodiment of the invention.

Then, the procedure to grow a single crystal copper film on the $BaF_2$ on gallium arsenide was conducted as follows. Once the barium fluoride deposition was completed the substrate temperature was lowered to 400° C. With a substrate temperature of 400° C., copper was deposited on the barium fluoride surface by using an electron beam heated source, as described for Example 1 hereinabove, located in the same chamber where the barium fluoride source resided. The parameters used in the electron beam heated source were 9 kilovolts and 0.15 miliamperes of current incident on the copper source. The conditions above produced a copper vapor flux of approximately $10^{12}$ atoms per $cm^2$ per second Such a flux would take one hour to grow a film of 150 angstroms in thickness. The deposition time was one hour, so that the grown copper film was 150 angstroms thick. All characterization done in situ using reflective high energy electron diffraction (RHEED) and x-ray photoelectron spectroscopy indicated that the copper film grown on barium fluoride on gallium arsenide had very similar properties to the one grown on a silicon substrate per Example 1 using barium fluoride films. Analysis using x-ray diffraction spectroscopy has provided at least preliminary results indicating that the orientation of the copper single crystal phase is along the (001) crystallographic direction. The results in the $Cu/BaF_2/GaAs$ specimen was consistent with all the results of the films grown on silicon. FIG. 9 is a RHEED figure showing linear "streaks" providing evidence of the crystalline nature of the copper film grown on the barium fluoride film provided on the GaAs substrate. A separate second GaAs substrate was processed in the above manner and yielded similar results, which confirmed the reproducibility and accuracy of the results.

While not desiring to be bound to any particular theory at this time, it nonetheless is theorized that the high quality single crystal metal film is grown on the metal halide barrier film provided on a substrate according to the following mechanism in this invention. Fluorine in the metal halide portion of the barrier film (e.g., $BaF_2$) reacts with incoming copper as the metal is deposited, thus having a self-cleaning, or etching-like effect. The barium that is left behind in the barrier film acts as a solid state surfactant. The action of the surfactant is analogous to a catalyst in a chemical reaction, i.e., it promotes a reaction without being consumed or incorporated itself into the final reaction product. Namely, it is thought that the surfactant promotes a surface solid state reaction, permitting copper atoms to settle into crystalline sites (with the correct bonding to its neighboring copper atoms). During deposition of the copper via MBE on the heated workpiece bearing the epitaxial barium fluoride barrier film, the hot copper atoms are believed to hit the barium atoms at the surface of the epitaxal $BaF_2$ film, and the surface layer of barium atoms having a low surface energy is thought to act as a template upon which the impinging copper can build-up in an ordered manner before infiltrating through the barium template layer. The ordered copper that passes through the planar template surface layer of barium atoms progressively collects upon the bulk remainder of the epitaxial barrier film below the barium surface template layer. The heated semiconductor surface provides energy which vibrates the deposited copper atoms, akin to shaking a stack of balls, to increase the ordering of the deposited copper.

Evidence for this solid state surfactant action of the barium atoms of the epitaxial barrier film, as described above, is indicated by depth profiling measurements taken of copper films that have been fabricated according to the present invention. As indicated in FIG. 8A, experimental studies that have been performed show that barium atoms are detected at the upper surface of the copper film and at the copper-barium fluoride interface, but not inside the bulk thickness of the copper film itself. These results are consistent with the solid state surfactant theory of the invention as described above.

In any event, a new feature of this invention is that a conductive metal layer or structure that is subsequently formed on top of the heteroepitaxial (composite) diffusion barrier is single crystalline in crystal structure. That is, this metal layer is devoid or essentially devoid of crystalline defects that are electron scatterers. The absence of scatterers allows electrons to move more freely inside the metal. This means that the metal or metallization layer has the lowest resistivity possible. Hence, it represents a dramatic advance in metallic interconnect technology.

As also was established by conducting standard peel strength tests on the metallized substrates of this example, an associated advantage is that the copper layer has strong adhesion to the $BaF_2$ layer, exemplified in part by the single crystalline nature of the metal layer. The present $Ba/BaF_2$ composite diffusion barrier scheme is therefore stable against external effects such as temperature and mechanical strains. With certain diffusion barrier schemes, sometimes a "seeding" layer is required on the top surface of the barrier in order for the copper atoms to adhere to the barrier material. Although not excluded by the scope of the present invention by any means, it also is apparent that no such "seeding" is required in the scheme of this invention.

It will be understood that the above-provided exemplary protocol is provided merely for sake of illustration, and not limitation. For instance, as indicated above the post-metal deposition annealing step is not required if the equivalent heating temperature is provided in situ during deposition of the copper (e.g., see alternative steps 10–11). For copper deposition, the deposition time is basically a function of the thickness desired, but otherwise is not limited beyond the general requirement that the copper deposition is halted no sooner that the appearance of the copper RHEED pattern. The single crystalline copper film can be formed by any suitable deposition technique and is not limited to the exemplified e-beam sourced evaporative method. The single crystal copper also could be deposited by PVD (e.g., ionizing PVD), CVD, and other suitable methods. The copper film can be deposited through its entire thickness with those methods. Alternatively, a thin "seed" layer of copper can be formed by e-beam sourced evaporation, PVD, or CVD methods, which is then built-up in thickness to the desired total thickness by electroplating or electroless plating techniques used for depositing copper.

Another noteworthy advantage of the invention is the relative simplicity and absence of protracted processing time requirements of the deposition process, even for the composite epitaxial barrier material/metal conductor structure formed. Also the stages required for forming the ultimate monolayer/metal halide/metal structure on the substrate may not necessarily be as clearly delineated in all actual practice, and may not necessitate distinct operations of the entire process from a temporal standpoint.

A further advantage is that the barium layer is compliant, i.e. it is mechanically soft and easily deformable. This compliance allows the top $BaF_2$ layer to be strain-free, and hence possible strain-related aging problem of the $BaF_2$ layer can be avoided. Still another advantage is that barium can form an intermetallic compound with copper ($BaCu_{12}$), causing copper atoms to be tightly bound to the barium, at the interface and also in the barium fluoride layer and unable to migrate past the composite diffusion barrier into the silicon.

Yet another advantage is that the barium fluoride layer need only be on the order of a few Ångstroms (10Å) to a few hundred Ångstroms in thickness for purposes of this invention. This meets the thickness requirements being sought currently for IC technology, and this benefit is possible at least in part because the barrier film will either smooth out the crystalline imperfections or fill up the unoccupied atomic positions on the substrates; thus blocking the diffusion pathway of the copper atoms.

Another advantage of the single crystalline Cu film that can be deposited over Si by this invention is that it can be used as a seed layer for thick Cu deposition by other methods, such as chemical or electrochemical deposition, which might be preferred by production processes since they are cheaper than the MBE process. Seeding on the barrier layer is also a concern for other barrier materials such as the nitride.

Still another advantage of the single crystalline Cu is that it is mechanically stronger than polycrystalline Cu. This could be important if/when the semiconductor industry decides to use GAS DOME technology for making interconnects. GAS DOME is described in GAS DOME SYSTEM, Semiconductor International, July 1999). The single crystalline Cu interconnect may then serve also as a mechanical support for a multilayer GAS DOME IC structure. It will be understood that this invention is not limited to the above-illustrated substrate materials, conductor materials, and materials used to make the diffusion barrier, as long as other criterion understood and set forth herein for these respective materials are satisfied.

In the mode of the invention being discussed above in which metal halides are used as precursor compound for forming the diffusion barrier film, the precursor compounds that can be used include, for example, $BaF_2$, $BaCl_2$, $SrF_2$, $SrCl_2$, CsFl, and CsCl, and the like. Especially preferred are those metal halide salts that have face centered cubic structure, e.g. a cubic fluorite, In another mode of the invention for forming the diffusion barrier film, the monolayer of metal atoms portion thereof alternatively can be formed in a one step operation (i.e., without a post-growth anneal step to decompose excess metal halide) by directly depositing an elemental form of the metal atoms, such as barium, via MBE on the surface of the semiconductor substrate. Since certain elemental metals such as barium are highly reactive, appropriate precautions have to be taken to handle, maintain and process the elemental barium in an inert environment, e.g., under an argon gas atmosphere, up until it is deposited upon the semiconductor.

The term "substrate" as used herein, is not particularly limited, and it can encompass a bulk wafer or, alternatively, a layer that is grown, deposited, formed or bonded upon another body. The present invention is especially concerned with substrates that are semiconductor, insulating or dielectric materials used in semiconductor device fabrications. The semiconductor substrate material can be monocrystalline or polycrystalline. The semiconductor substrate can be in bulk wafer form, or deposited or grown layer form (e.g., epitaxially grown), or silicon-on-insulator (SOI) or silicon-on-sapphire (SOS) form. The semiconductor material substrate can be, for example, single crystal silicon, polycrystalline silicon, silicon-on-insulator (SOI), silicon-on-sapphire (SOS), gallium arsenide, silicon carbide, indium phosphide, gallium nitride, aluminum nitride, germanium, indium antimonide, lead telluride, cadmium telluride, mercury-cadmium telluride, lead selenide, lead sulfide, and tertiary and quaternary combinations of these materials. The semiconductor can be undoped, or doped with impurities (e.g., p-, n-doping). The insulating or dielectric substrate material can be, for example, silicon oxide ($SiO_x$) (e.g., $SiO_2$), $BaF_2$, $SrF_2$, $CaF_2$, silicon nitride, PSG, or BPSG, as well as bulk crystals of metal halides.

As to the types of conductor structures that can be formed on the diffusion barrier, these include conventional metals and metal alloys used for wiring line, interconnects, bonding pads, via plugs, filled trenches, and so forth, in semiconductor device or opto-electronic device fabrication. Moreover, the conductor structures of this invention can be formed at one or more levels of a metallization scheme. The present invention is especially usefull for providing an in situ barrier to electrically conductive metals which tend to diffuse into semiconductor and insulating materials common to semiconductor processing. These conductive metals include the transition metals (e.g., elemental copper, silver, gold, platinum, and so forth). The conductor film can be patterned on the diffusion barrier by various standard techniques, such as by additive or subtractive processes known or useful in semiconductor processing (e.g., photolithographic processing, damascene patterning).

Also, while the barrier film used in this invention has been illustrated herein specifically as a metal growth medium and barrier to diffusion of metal conductors into substrate materials, it will be understood that the barrier film is not necessarily limited to that use alone, as it possesses many advantageous attributes that could be exploited in semiconductor device fabrications. For example, the barrier film could be used as a barrier layer in the fabrication of a wide variety of semiconductors devices including transistors (e.g., MOSFET, MISFET, BiCMOS, etc.), diodes (e.g., Schotkky-barrier diode), memory devices (e.g., DRAMs), optical mirrors, and semiconductor laser devices, such as those having heterojunctions and incorporating different semiconductor materials, e.g., GaAs on top of silicon, and so forth. The barrier film can be formed continuously across an exposed substrate surface. Alternatively, the barrier film can be discontinuous where it can be patterned during its deposition, or deposited on an unmasked substrate and then patterned prior to metal deposition, to only intermittently cover the substrate surface at specific surface subregions where needed for the diffusion barrier function.

While the invention has been shown and described with reference to certain preferred embodiments, it will be understood by those skilled in the art that changes in form and detail may be made without departing from the spirit and scope of the appended claims.

What is claimed is:

1. A semiconductor device, comprising a substrate having a substrate surface, a barrier film on the substrate surface, and a single crystal transition metal on the barrier film,
   wherein the barrier film comprises a first layer comprising elemental metal atoms and a second layer comprising a metal halide,
   the first layer of the barrier film is in contact with the substrate surface,
   the second layer of the barrier film is in contact with the single crystal transition metal, and
   the first and second layers of the barrier film are in contact with each other.

2. A semiconductor device according to claim 1, wherein the barrier film has a thickness less than approximately 250 Å.

3. A semiconductor device according to claim 1, wherein the barrier film has a thickness less than approximately 100 Å.

4. A semiconductor device according to claim 1, wherein the barrier film has a thickness in the range of approximately 20 to approximately 75 Å.

5. A semiconductor device according to claim 1, wherein the transition metal comprises an elemental transition metal.

6. A semiconductor device according to claim 1, wherein the transition metal is selected from the group consisting of copper, silver, gold and platinum.

7. A semiconductor device according to claim 1, wherein the transition metal comprises copper.

8. A semiconductor device according to claim 1, wherein the barrier film comprises a heteroepitaxial film structure, the first layer of the barrier film comprises a monolayer of metal atoms selected from the group consisting of barium atoms, strontium atoms, cesium atoms, and mixtures thereof, and wherein the metal halide is selected from the group consisting of barium halide, strontium halide and cesium halide.

9. A semiconductor device according to claim 1, wherein the substrate is selected from the group consisting of single crystal silicon, polycrystalline silicon, SOI, SOS, gallium arsenide, silicon carbide, indium phosphide, gallium nitride, aluminum nitride, germanium, indium antimonide, lead telluride, cadmium telluride, mercury-cadmium telluride, lead selenide, lead sulfide, and tertiary and quaternary combinations of these materials.

10. A semiconductor device according to claim 1, wherein the substrate comprises single crystal silicon.

11. A semiconductor device according to claim 1, wherein the substrate comprises single crystal gallium arsenide.

12. A semiconductor device comprising a single crystal substrate having a substrate surface, a barrier film in contact with the substrate surface, and a single crystal transition metal in contact with the barrier film, wherein said barrier film comprises homoepitaxial metal halide and said barrier film has a thickness less than approximately 100 Å.

13. A semiconductor device according to claim 12, wherein the substrate is selected from the group consisting of silicon and silicon oxide, the metal halide is selected from the group consisting of barium halide and strontium halide, and said metal is selected from the group consisting of copper, gold, silver, and platinum.

14. A process for making a semiconductor device comprising the steps of:

forming a first layer comprising first elemental metal atoms on a surface of a substrate;

forming a second layer comprising a metal halide on the first layer; and forming a single crystal transition metal on the second layer, wherein the first layer is in contact with the surface of the substrate, the first and second layer are in contact with each other, and the single crystal transition metal is in contact with the second layer.

15. A process for making a semiconductor device according to claim 14, wherein the second layer is a homoepitaxial layer comprising a metal halide selected from the group consisting of barium halide, strontium halide, and cesium halide.

16. A process for making a semiconductor device according to claim 14, wherein the second layer comprises a material selected from the group consisting of $BaF_2$, $BaCl_2$, $SrF_2$, CsF, or CsCl.

17. A process for making a semiconductor device according to claim 14, wherein the first and second layers, taken together, have a thickness of less than 100 Å.

18. A process for making a semiconductor device according to claim 14, wherein the first and second layers, taken together, have a thickness ranging from 20 Å to approximately 75 Å.

19. A process for making a semiconductor device according to claim 14, wherein the transition metal is selected from the group consisting of copper, silver, gold and platinum.

20. A process for making a semiconductor device according to claim 14, wherein the transition metal comprises copper.

21. A process for making a semiconductor device according to claim 14, wherein the substrate material comprises a semiconductor.

* * * * *